United States Patent
Chang et al.

(10) Patent No.: US 12,520,597 B2
(45) Date of Patent: *Jan. 6, 2026

(54) INTEGRATED CIRCUIT STRUCTURE HAVING TAP CELL

(71) Applicant: Taiwan Semiconductor Manufacturing Company, Ltd., Hsinchu (TW)

(72) Inventors: Yung-Feng Chang, Hsinchu (TW); Bao-Ru Young, Hsinchu County (TW); Tung-Heng Hsieh, Hsinchu County (TW); Chun-Chia Hsu, Kaohsiung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/592,390

(22) Filed: Feb. 29, 2024

(65) Prior Publication Data
US 2024/0203976 A1 Jun. 20, 2024

Related U.S. Application Data

(60) Continuation of application No. 17/989,686, filed on Nov. 18, 2022, now Pat. No. 11,948,935, which is a division of application No. 16/880,939, filed on May 21, 2020, now Pat. No. 11,527,527.

(51) Int. Cl.
*H10D 89/60* (2025.01)
*G06F 30/392* (2020.01)
*H10D 84/01* (2025.01)
*H10D 84/03* (2025.01)
(Continued)

(52) U.S. Cl.
CPC ............ *H10D 89/60* (2025.01); *G06F 30/392* (2020.01); *H10D 84/01* (2025.01); *H10D 84/859* (2025.01); *H10D 89/10* (2025.01); *H10D 84/0188* (2025.01); *H10D 84/038* (2025.01)

(58) Field of Classification Search
CPC ...... H10D 89/10; H10D 89/60; H10D 84/859; H10D 89/859; G06F 30/392
See application file for complete search history.

(56) References Cited

U.S. PATENT DOCUMENTS

| 8,796,666 B1 | 8/2014 | Huang et al. |
| 8,815,712 B2 | 8/2014 | Wan et al. |
| 8,963,258 B2 | 2/2015 | Yu et al. |

(Continued)

*Primary Examiner* — Vincent Wall
(74) *Attorney, Agent, or Firm* — JCIPRNET

(57) ABSTRACT

Provided is a tap cell including a substrate, a first well, a second well, a first doped region, and the second doped region. The substrate has a first region and a second region. The first well has a first dopant type and includes a first portion disposed in the first region and a second portion extending into the second region. The second well has a second dopant type and includes a third portion disposed in the second region and a fourth portion extending into the first region. The first doped region having the first dopant type is disposed in the second portion of the first well and the third portion of the second well along the second region. The second doped region having the second dopant type is disposed in the first portion of the first well and the fourth portion of the second well along the first region.

20 Claims, 8 Drawing Sheets

(51) Int. Cl.
  *H10D 84/85*   (2025.01)
  *H10D 89/10*   (2025.01)

(56) References Cited

U.S. PATENT DOCUMENTS

| | | | |
|---|---|---|---|
| 9,093,530 B2 | 7/2015 | Huang et al. | |
| 9,171,929 B2 | 10/2015 | Lee et al. | |
| 9,214,555 B2 | 12/2015 | Oxland et al. | |
| 9,236,267 B2 | 1/2016 | De et al. | |
| 9,520,482 B1 | 12/2016 | Chang et al. | |
| 9,548,303 B2* | 1/2017 | Lee | H10D 86/215 |
| 9,576,814 B2 | 2/2017 | Wu et al. | |
| 10,593,604 B1* | 3/2020 | Lam | H01L 22/12 |
| 2002/0026261 A1* | 2/2002 | Clark | H10D 84/90 |
| | | | 700/121 |
| 2010/0078725 A1* | 4/2010 | Hou | H10D 89/10 |
| | | | 257/E27.06 |
| 2014/0145293 A1* | 5/2014 | Jain | H01L 23/552 |
| | | | 438/597 |
| 2015/0008533 A1* | 1/2015 | Liaw | H10D 84/0193 |
| | | | 257/392 |
| 2015/0270181 A1* | 9/2015 | De | H01J 37/147 |
| | | | 438/14 |
| 2015/0318407 A1* | 11/2015 | Chen | H10D 62/393 |
| | | | 257/296 |
| 2016/0372316 A1* | 12/2016 | Yang | H10D 84/0158 |
| 2017/0213814 A1* | 7/2017 | Thazhathidathil | |
| | | | H10D 84/0156 |
| 2018/0151559 A1* | 5/2018 | Sio | H10D 84/85 |
| 2019/0096870 A1* | 3/2019 | Liaw | H10D 84/856 |
| 2019/0164949 A1* | 5/2019 | Sio | H10D 89/10 |
| 2019/0164971 A1* | 5/2019 | Liaw | H10D 84/0188 |
| 2019/0287966 A1* | 9/2019 | Guler | H10D 84/834 |
| 2019/0326300 A1* | 10/2019 | Liaw | H10D 62/292 |
| 2020/0135724 A1* | 4/2020 | Lin | H01L 23/485 |
| 2020/0152578 A1* | 5/2020 | Gifford | H10D 84/0191 |
| 2021/0175171 A1* | 6/2021 | Jung | H01L 23/5286 |
| 2021/0366895 A1* | 11/2021 | Chang | H10D 89/60 |
| 2022/0037365 A1* | 2/2022 | Huang | G06F 30/392 |

* cited by examiner

INTEGRATED CIRCUIT STRUCTURE HAVING TAP CELL

CROSS-REFERENCE TO RELATED APPLICATION

This is a continuation application of and claims the priority benefit of U.S. application Ser. No. 17/989,686, filed on Nov. 18, 2022, now allowed. The U.S. application Ser. No. 17/989,686 is a divisional application of and claims the priority benefit of U.S. application Ser. No. 16/880,939, filed on May 21, 2020, now patented. The entirety of each of the above-mentioned patent applications is hereby incorporated by reference herein and made a part of this specification.

BACKGROUND

As integrated circuits become smaller in physical size, and the quantity of transistors included in the device increases, smaller line widths are used in the integrated circuits, and the transistors therein are located closer together. Latch-up is a type of short circuit that sometimes occurs in integrated circuits. To prevent latch-up, some integrated circuits include tap cells. Since the tap cells need to be placed with appropriate distances from each other, the integrated circuit may include many tap cells which result in increasing the overall size of the integrated circuit.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
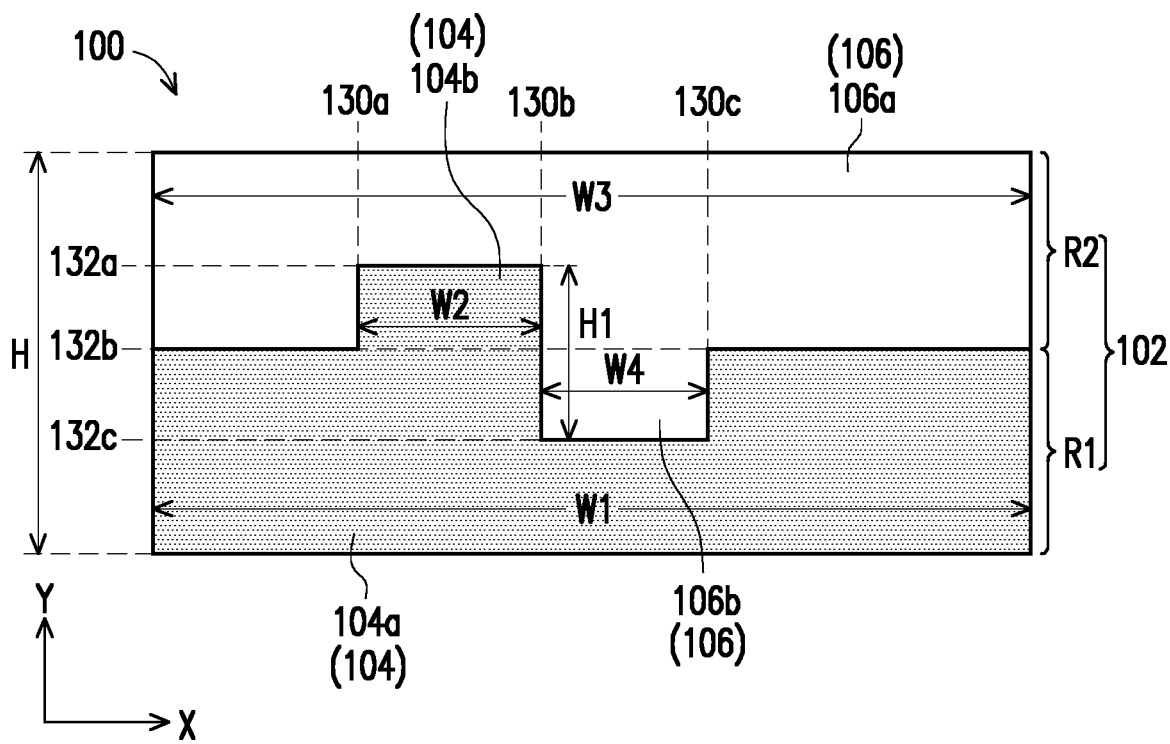
FIG. 1A to FIG. 1C are diagrams of a top view of a layout design of a tap cell in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

In accordance with some embodiments, an integrated circuit structure includes a standard cell and a tap cell adjacent to each other, a first well and a second well continuously extending through the standard cell and the tap cell, a first set of implants at least disposed in the first jog of the first well to be coupled to a first supply voltage, and a first active region continuously extending from the first jog of the first well through the tap cell and the standard cell. In the case, the tap cell may prevent the undesirable latch-up of the integrated circuit. In addition, the first active region continuously extends from the first jog through the tap cell and the standard cell, and does not have any break between the tap cell and the standard cell, thereby eliminating the LOD (Length of Diffusion) effect and decreasing ion degradation within the tap cell and also along the edge of tap cell. In the present embodiment, the driving current capability is improved over other approaches with non-continuous active region.

Figure 1B:
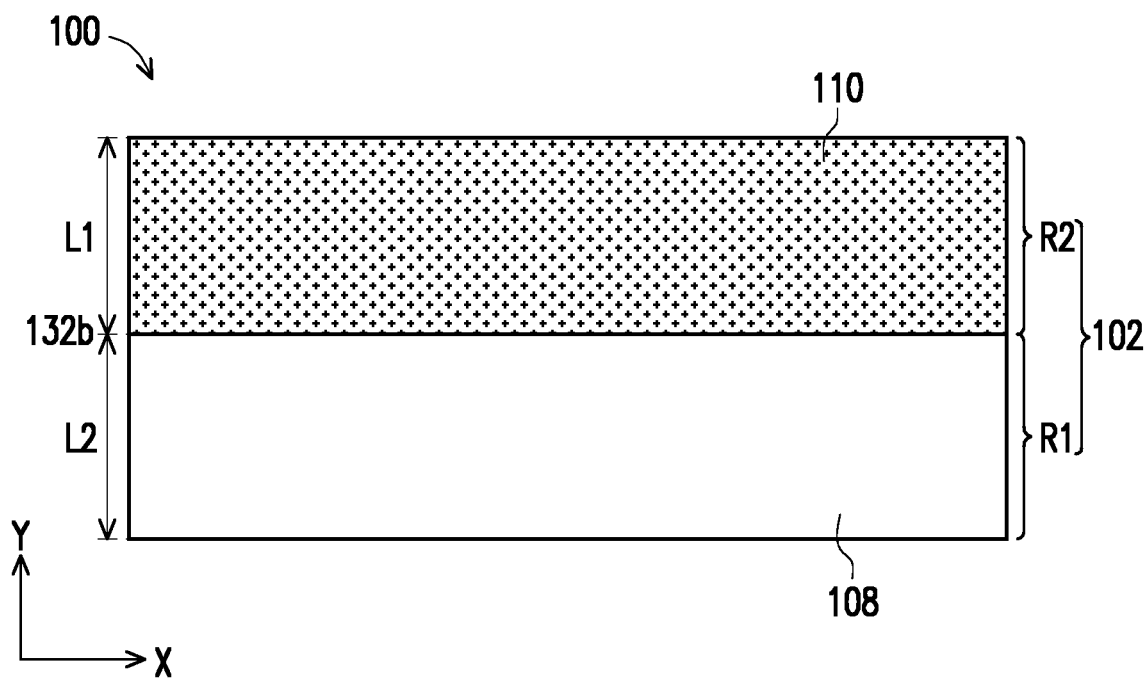
Figure 1C:
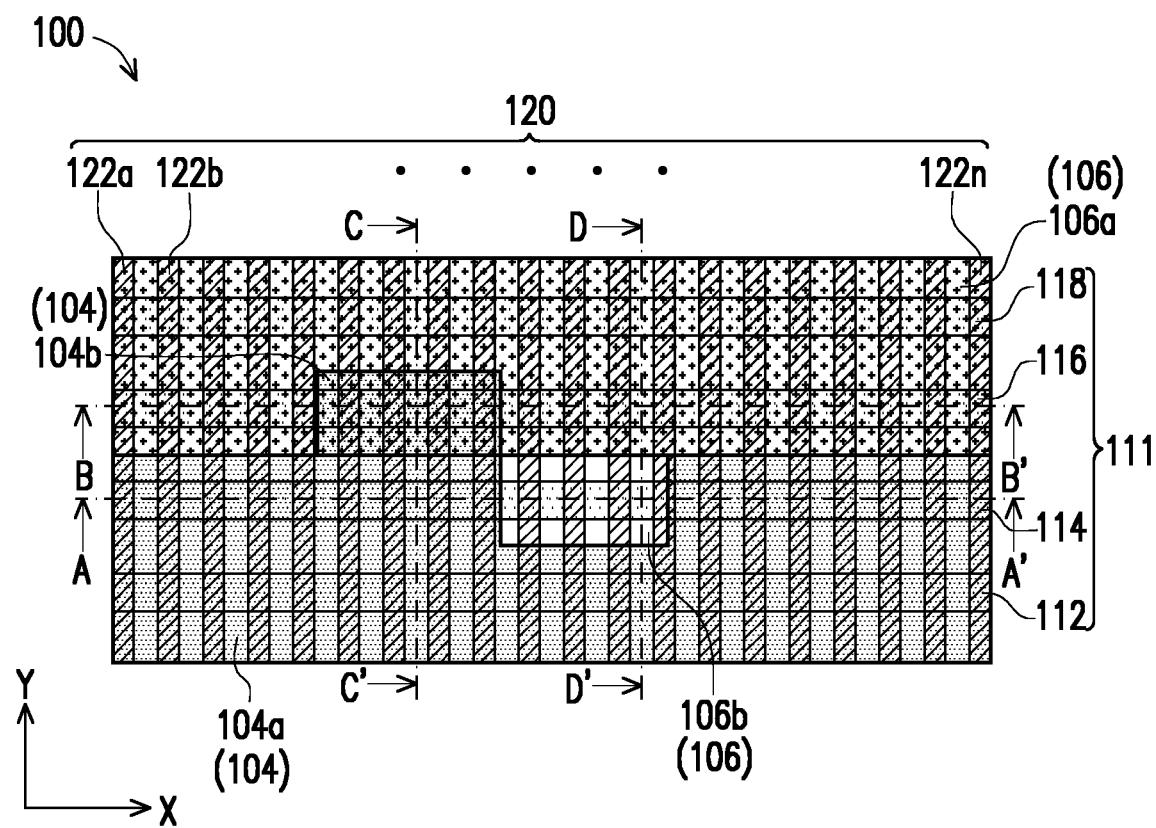

FIG. 1A to FIG. 1C are diagrams of a top view of a layout design 100 of a tap cell in accordance with some embodiments. For case of illustration, FIG. 1A is a top view of a first layout level of layout design 100, and FIG. 1B is a top view of a second layout level of layout design 100. In some embodiments, FIG. 1C includes additional elements not shown in FIG. 1A or 1B for case of illustration.

Referring to FIG. 1A, the layout design 100 includes a substrate layout pattern 102, a first well layout pattern 104, and a second well layout pattern 106. In some embodiments, the substrate layout pattern 102 has a first region R1 and a second region R2 extending along an X direction. The first region R1 and the second region R2 may be adjacent to each other and in contact with each other in a Y direction.

Figure 2A:
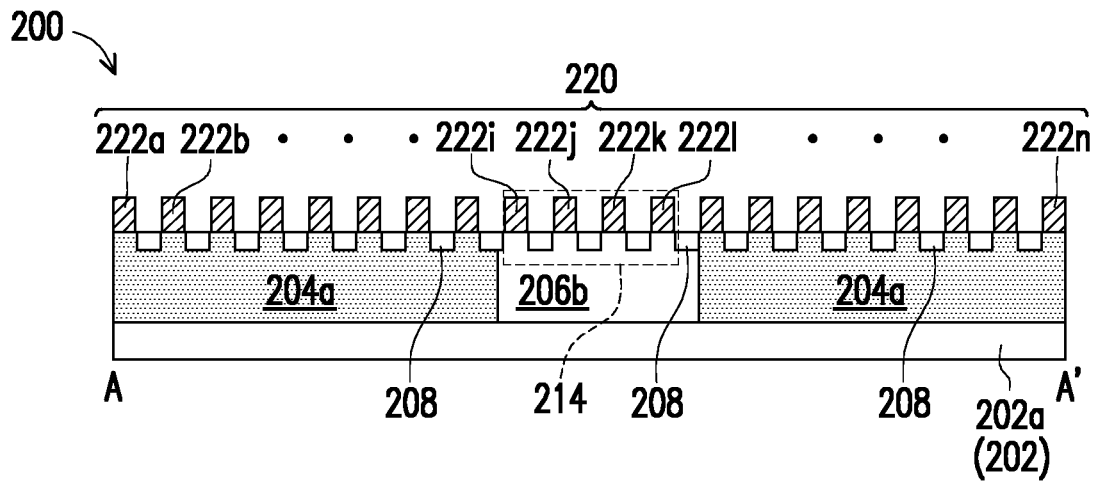
FIG. 2A to FIG. 2D are cross-sectional views of a tap cell in accordance with some embodiments.

The first well layout pattern 104 is on a first layout level and is usable to manufacture a corresponding first well 204 in a substrate 202 (FIGS. 2A-2D). Specifically, the first well layout pattern 104 may include a first layout pattern 104a in the first region R1 and a second layout pattern 104b extending into in the second region R2. The first layout pattern 104a and the second layout pattern 104b are usable to manufacture a corresponding first portion 204a (FIG. 2A)

and a corresponding second portion 204*b* (FIG. 2B) of the first well 204. In some embodiments, the second layout pattern 104*b* is referred to as first jog pattern extending from an upper surface of the first layout pattern 104*a* into the second well layout pattern 106. From another perspective, as shown in FIG. 1A, the second layout pattern 104*b* may extending from an interface of the first region R1 and the second region R2 into the second region R2. In some embodiments, the first layout pattern 104*a* is adjacent to the second layout pattern 104*b*. The first layout pattern 104*a* extends in the X direction and has a first width W1, and the second layout pattern 104*b* also extends in the X direction and has a second width W2. The first width W1 may be greater than the second width W2. In some embodiments, the first layout pattern 104*a* and the second layout pattern 104*b* are a single, continuous layout pattern. In some alternative embodiments, the first layout pattern 104*a* and the second layout pattern 104*b* are discretely generated albeit continuous layout patterns.

The second well layout pattern 106 is on the first layout level and is usable to manufacture a corresponding second well 206 in the substrate 202 (shown in FIGS. 2A-2D). Specifically, the second well layout pattern 106 may include a third layout pattern 106*a* in the second region R2 and a fourth layout pattern 106*b* extending into in the first region R1. The third layout pattern 106*a* and the fourth layout pattern 106*b* are usable to manufacture a corresponding third portion 206*a* (FIG. 2B) and a corresponding fourth portion 206*b* (FIG. 2A) of the second well 206. In some embodiments, the fourth layout pattern 106*b* is referred to as second jog pattern extending from a lower surface of the third layout pattern 106*a* into the first well layout pattern 104. From another perspective, as shown in FIG. 1A, the fourth layout pattern 106*b* may extending from the interface of the first region R1 and the second region R2 into the first region R1. In some embodiments, the third layout pattern 106*a* is adjacent to the fourth layout pattern 106*b*. The third layout pattern 106*a* extends in the X direction and has a third width W3, and the fourth layout pattern 106*b* also extends in the X direction and has a fourth width W4. The third width W3 may be greater than the fourth width W4. The fourth width W4 and the second width W2 may be the same or different to each other. In some embodiments, the third layout pattern 106*a* and the fourth layout pattern 106*b* are a single, continuous layout pattern. In some alternative embodiments, the third layout pattern 106*a* and the fourth layout pattern 106*b* are discretely generated albeit continuous layout patterns.

One or more edges of layout pattern 104*b* or 106*a* is aligned with a gridline 130*a*; one or more edges of layout pattern 104*b* or 106*b* is aligned with a gridline 130*b*; and one or more edges of layout pattern 104*a* or 106*b* is aligned with a gridline 130*c*. The gridlines 130*a*, 130*b*, and 130*c* extend in the Y direction. In addition, one or more edges of layout pattern 104*b* or 106*a* is aligned with a gridline 132*a*; one or more edges of layout pattern 104*a* or 106*a* is aligned with a gridline 132*b*; and one or more edges of layout pattern 104*a* or 106*b* is aligned with a gridline 132*c*. The gridlines 132*a*, 132*b*, and 132*c* extend in the X direction. In some embodiments, the second layout pattern 104*b* is engaged with or embedded in the third layout pattern 106*a*. The fourth layout pattern 106*b* may be engaged with or embedded in the first layout pattern 104*a*. The second layout pattern 104*b* may be adjacent to or be in contact with the fourth layout pattern 106*b*. As shown in FIG. 1A, a step difference (jog difference) H1 is between the second layout pattern 104*b* and the fourth layout pattern 106*b*. Herein, the step difference H1 is measured from the gridline 132*a* to the gridline 132*c* in the Y direction. In some embodiments, a ratio of a height H of the layout design 100 in the Y direction to the step difference H1 (H/H1) is in a range of 1.5 to 2.5.

Referring to FIG. 1B, the layout design 100 further includes a first implant layout pattern 110 and a second implant layout pattern 108 adjacent to the first implant layout pattern 110. The first implant layout pattern 110 and the second implant layout pattern 108 are on a second layout level. The second layout level is different from the first layout level. In some embodiments, the second layout level is above the first layout level. In some alternative embodiments, the second layout level is below or the same as the first layout level.

The first implant layout pattern 110 is usable to manufacture a corresponding first set of implants 210 (FIG. 2B) in the second portion 204*b* of the first well 204 and the third portion 206*a* of the second well 206. As shown in FIG. 1B, the first implant layout pattern 110 extends along the X direction and is disposed in the second region R2. The first implant layout pattern 110 may have a first length L1 in the Y direction, and the first length L1 may have a substantially uniform length along the X direction. In some embodiments, the first implant layout pattern 110 overlaps the second layout pattern 104*b* and continuously extends from the second layout pattern 104*b* through the third layout pattern 106*a* along the X direction. An edge of the first implant layout pattern 110 is aligned with an edge of the first layout pattern 104*a* along the gridline 132*b*.

The second implant layout pattern 108 is usable to manufacture a corresponding second set of implants 208 (FIG. 2A) in the first portion 204*a* of the first well 204 and the fourth portion 206*b* of the second well 206. As shown in FIG. 1B, the second implant layout pattern 108 extends along the X direction and is disposed in the first region R1. The second implant layout pattern 108 may have a second length L2 in the Y direction, and the second length L2 may have a substantially uniform length along the X direction. In some embodiments, the second implant layout pattern 108 overlaps the fourth layout pattern 106*b* and continuously extends from the fourth layout pattern 106*b* through the first layout pattern 104*a* along the X direction. An edge of the second implant layout pattern 108 is aligned with or in contact with the edge of the first implant layout pattern 110 along the gridline 132*b*.

Referring to FIG. 1C, the layout design 100 further includes a set of active region layout patterns 111. The set of active region layout patterns 111 may include a plurality of active region patterns 112, 114, 116 and 118. The set of active region layout patterns 111 may be a portion of the layout design 100 representing an active region (or oxide-definition (OD) regions) in an IC structure 200. In some embodiments, at least one of the active region patterns 112, 114, 116 or 118 represents at least one drain region or source region of a transistor device. In some embodiments, the layout design 100 corresponds to a layout design of a tap cell. In some embodiments, the tap cell is a region of the IC structure 200 (shown in FIGS. 2A-2D) utilized to provide a bias voltage (e.g., VDD or VSS) for the substrate 202, the first well 204 or the second well 206.

The active region pattern 116 in the second layout pattern 104*b* represents the portion of the layout design 100 coupled to the first supply voltage VDD to provide the first supply voltage VDD as a bias voltage to the first set of implants 210 in the second portion 204*b* of the first well 204. The active region pattern 116 in the second layout pattern 104*b* may correspond to a region 216 of FIG. 2B. In some alternative embodiments, the active region pattern 116 in the second layout pattern 104b represents the portion of the layout design 100 coupled to the second supply voltage VSS to provide the second supply voltage VSS as the bias voltage to the first set of implants 210 in the second portion 204b of the first well 204. In some embodiments, the first supply voltage VDD is different from the second supply voltage VSS. For example, the first supply voltage VDD is the highest voltage, while the second supply voltage VSS is the lowest voltage or grounded.

On the other hands, the active region pattern 114 in the fourth layout pattern 106b represents the portion of the layout design 100 coupled to the second supply voltage VSS to provide the second supply voltage VSS as the bias voltage to the second set of implants 208 in the fourth portion 206b of the second well 206. The active region pattern 114 in the fourth layout pattern 106b may correspond to a region 214 of FIG. 2A. In some alternative embodiments, the active region pattern 114 in the fourth layout pattern 106b represents the portion of the layout design 100 coupled to the first supply voltage VDD to provide the first supply voltage VDD as a bias voltage to the second set of implants 208 in the fourth portion 206b of the second well 206.

The active region patterns 112, 114, 116, 118 extend in the X direction continuously through the layout design 100. For example, in the X direction, the active region patterns 112, 114, 116, 118 extend beyond an edge of a gate layout pattern 122a or 122n.

As shown in FIG. 1C, the layout design 100 further includes a set of gate layout patterns 122a, 122b, . . . , 122n (collectively referred to as "set of gate layout patterns 120") on a third layout level. Other configurations or numbers of the gate layout patterns in the set of gate layout patterns 120 is within the scope of the present disclosure. The third layout level is different from the first layout level or the second layout level. In some embodiments, the third layout level is above the first or second layout level. In some alternative embodiments, the third layout level is below or the same as the first layout level or the second layout level. In some other embodiments, the third layout level is between the first layout level and the second layout level.

The set of gate layout patterns 120 extends in the Y direction and overlap the first well layout pattern 104 and the second well layout pattern 106. Each gate layout pattern of the set of gate layout patterns 120 may extend in the Y direction, and may be separated from each other in the X direction. The set of gate layout patterns 120 is usable to manufacture a corresponding set of gates 220 (FIGS. 2A-2B) in the IC structure 200.

In some embodiments, at least one of the active region patterns 112, 114, 116, and 118 has SiGe (not labelled). In the present embodiment, by continuously extending the active region patterns 112, 114, 116, and 118 through the edges of the layout design 100 or through adjacent cells (e.g., shown in FIG. 3), causes an increase in the compressive strain of the SiGe of the IC structure 200 (e.g., shown in FIGS. 2A-2D) and the layout design 100 compared to other approaches. In some embodiments, by increasing the compressive strain of the SiGe of the IC structure 200 (e.g., shown in FIGS. 2A-2D) and the layout design 100, the advantages for the SiGe of the IC structure 200 and the layout design 100 are maximized, including one or more of an increased current gain and increased driving current capability of the IC structure 200 and the layout design 100. In some embodiments, by having an improved compressive strain of the SiGe of the layout design 100 or the IC structure 200, the IC structure 200 or the layout design 100 is able to have similar driving current capability as other approaches while occupying less area than the other approaches resulting in an overall reduction in physical size of the layout design 100 or the IC structure 200. In some embodiments, when an area of the layout design 100 is reduced by 0.6% or more compared with an area of other layout designs, the layout design 100 still maintains a similar driving current capability as that of the other layout designs.

In some embodiments, by continuously extending the active region patterns 112, 114, 116, and 118 through the edges of the layout design 100 or through adjacent standard cells (e.g., shown in FIG. 3), the layout design 100 does not have a break in the active region patterns 112, 114, 116, and 118. In the case, the LOD effect would be eliminated, the ion degradation within and/or along the edge of the layout design 100 is also decreased, thereby causing improved driving current capability over other approaches.

Figure 2B:
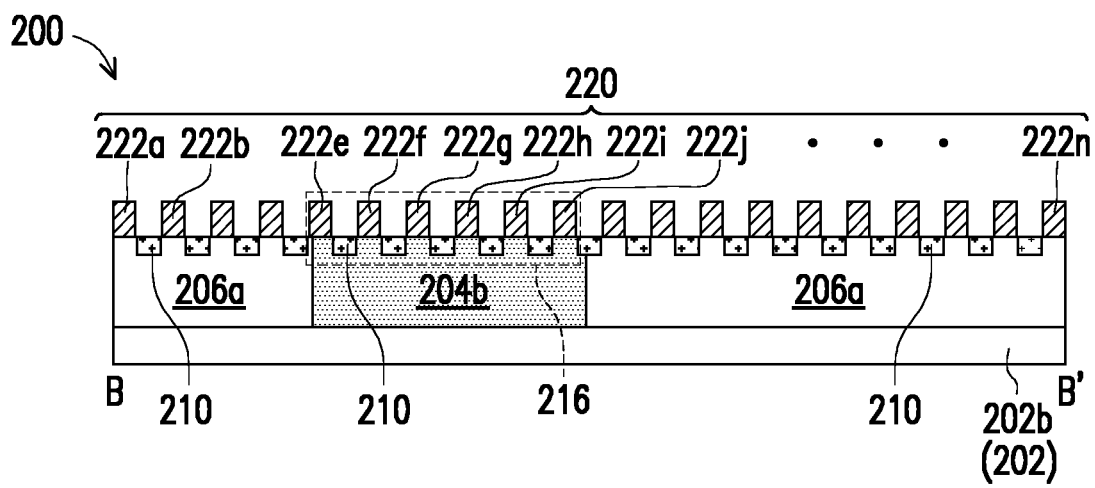
Figure 2C:
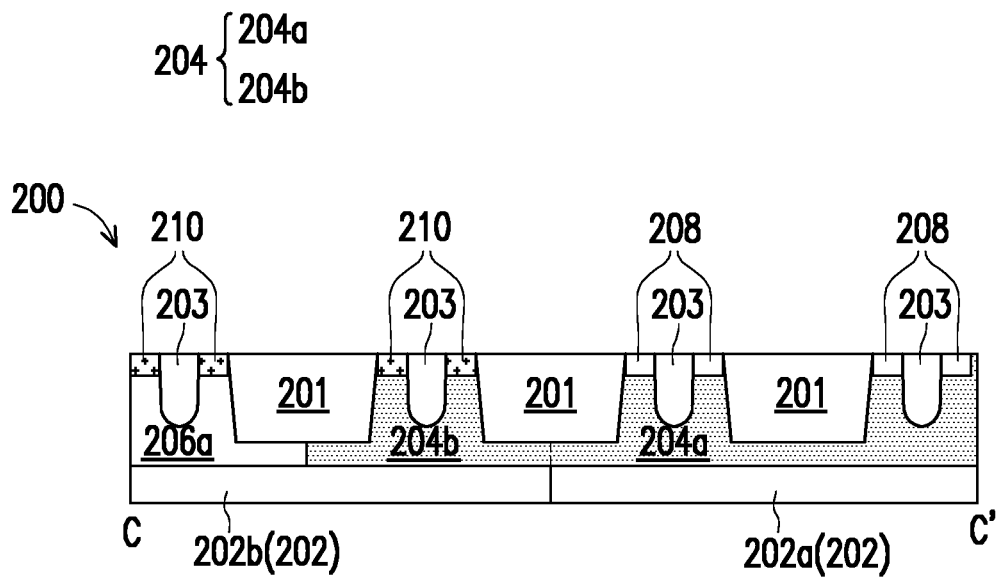
Figure 2D:
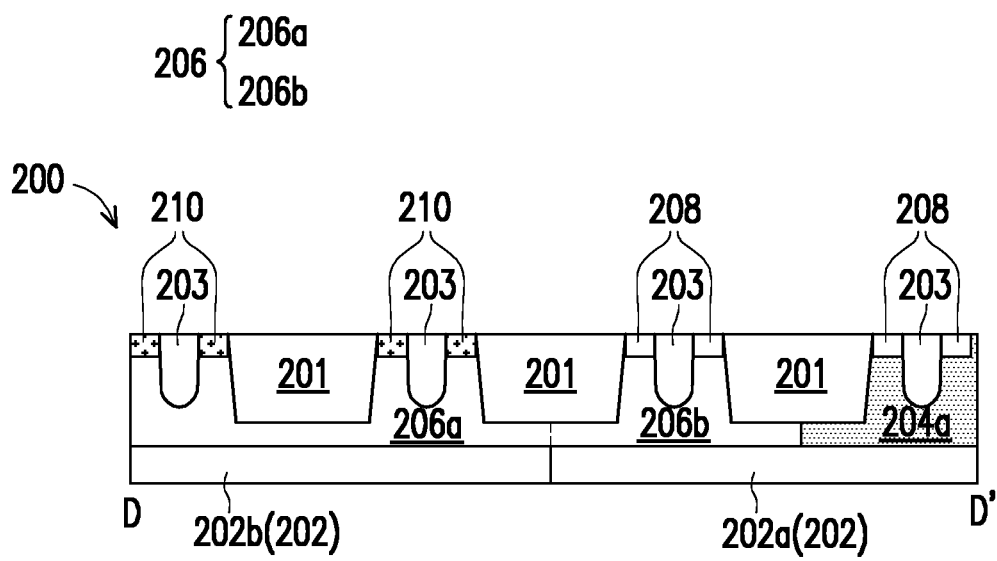

FIG. 2A to FIG. 2D are cross-sectional views of a tap cell in accordance with some embodiments. FIG. 2A is a cross-sectional view of the IC structure 200 corresponding to the layout design 100 as intersected by a plane A-A', FIG. 2B is a cross-sectional view of the IC structure 200 corresponding to the layout design 100 as intersected by a plane B-B', and FIG. 2C is a cross-sectional view of the IC structure 200 corresponding to the layout design 100 as intersected by a plane C-C', and FIG. 2D is a cross-sectional view of the IC structure 200 corresponding to the layout design 100 as intersected by a plane D-D', in accordance with some embodiments. The IC structure 200 is manufactured by the layout design 100.

The IC structure 200 includes a substrate 202 having a first region 202a and a second region 202b. In some embodiments, the substrate 202 may be a semiconductor substrate, such as a bulk semiconductor, a semiconductor-on-insulator (SOI) substrate, or the like, which may be doped (e.g., with a p-type or an n-type dopant) or undoped. The substrate 202 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 202 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In some alternative embodiments, the substrate 202 includes bulk-Si, SiP, SiGe, SiC, SiPC, Ge, SOI—Si, SOI—SiGe, III-VI material, or a combination thereof.

The IC structure 200 further includes a first well 204 and a second well 206. The first well 204 includes a first dopant type impurity. The first dopant type is an n-type dopant impurity. In some alternative embodiments, the first dopant type is a p-type dopant impurity. The first well 204 includes a first portion 204a and a second portion 204b. As shown in FIG. 2A, the first portion 204a of the first well 204 is in the first region 202a. As shown in FIG. 2B, the second portion 204b of the first well 204 extends into the second region 202b. In some embodiments, the first well 204 includes Si, Ge, SiGe, InAs, InGaAs, InAlAs, InP, or the like.

The second well 206 includes a second dopant type impurity. The second dopant type is a p-type dopant impurity. In some alternative embodiments, the second dopant type is an n-type dopant impurity. The second well 206 includes a third portion 206a and a fourth portion 206b. As shown in FIG. 2B, the third portion 206a of the second well 206 is in the second region 202b, and the second portion 204b of the first well 204 is disposed between the third portion 206a of the second well 206. As shown in FIG. 2A, the fourth portion 206b extends into the first region 202a, and the fourth portion 206b is disposed between the first portion 204a of the first well 204. In some embodiments, the second well 206 includes Si, Ge, SiGe, InAs, InGaAs, InAlAs, InP, or the like. The second well 206 and the first well 204 have different dopant type impurities.

As shown in FIG. 2A and FIG. 2B, the IC structure 200 further includes a first set of implants 210 and a second set of implants 208. In some embodiments, the first set of implants 210 is referred to as first doped regions 210, the second set of implants 208 is referred to as second doped regions 208, and the first doped regions 210 have different conductivity types from the second doped regions 208. For example, the first doped regions 210 have a n-type conductivity type, and the second doped regions 208 have a p-type conductivity type, vice versa. In some alternative embodiments, the first set of implants 210 includes P, As, or the like, and the second set of implants 208 includes B, Ga, or the like.

In some embodiments, each implant of the first set of implants 210 has the first dopant type (e.g., n-type), and is separated from each other in the X direction, as shown in FIG. 2B. In some embodiments, at least one implant of the first set of implants 210 is configured to be coupled to the first supply voltage VDD. In some alternative embodiments, at least one implant of the first set of implants 210 has the second dopant type (e.g., p-type) and is configured to be coupled to the second supply voltage VSS.

In some embodiments, each implant of the second set of implants 208 has the second dopant type (e.g., p-type), and is separated from each other in the X direction, as shown in FIG. 2A. In some embodiments, at least one implant of the second set of implants 208 is configured to be coupled to the second supply voltage VSS. In some alternative embodiments, at least one implant of the second set of implants 208 has the first dopant type (e.g., n-type) and is configured to be coupled to the first supply voltage VDD.

The IC structure 200 further includes a set of gates 220 (FIGS. 2A-2B). The set of gates 220 includes gates 222a, 222b, . . . , 222n. Other configurations or numbers of gates in the set of gates 220 is within the scope of the present disclosure. Each gate of the set of gates 220 extends in the Y direction, and is separated from each other in the X direction. The set of gates 220 represents one or more gates of one or more NMOS or PMOS transistor devices. Other transistor types are within the scope of the present disclosure. As shown in FIGS. 2A-2B, the set of gates 220 is over the substrate 202. At least one implant of the first set of implants 210 or the second set of implants 206 is between a pair of gates of the set of gates 220.

As shown in FIG. 2A and FIG. 2B, the first and second regions 202a and 202b of the substrate 202 of the IC structure 200 are manufactured by the corresponding first and second regions R1 and R2 of the substrate layout pattern 102 (FIG. 1A and FIG. 1C). The first portion 204a of the first well 204 and the fourth portion 206b of the second well 206 are disposed in the first region 202a. The fourth portion 206b is sandwiched between the first portion 204a. On the other hand, the second portion 204b of the first well 204 and the third portion 206a of the second well 206 are disposed in the second region 202b. The second portion 204b is sandwiched between third portion 206a. In the present embodiment, the first well 204 is used to fabricate PMOS transistor devices, while the second well 206 is used to fabricate NMOS transistor devices. In some alternative embodiments, the first well 204 is used to fabricate NMOS transistor devices, while the second well 206 is used to fabricate PMOS transistor devices.

As shown in FIG. 2A, the region 214 corresponds to the active region pattern 114 of the layout design 100 of FIG. 1C. The region 214 is a tap cell of the IC structure 200 and is coupled to the second voltage supply VSS. In other words, the region 214 is configured to provide the second supply voltage VSS as the bias voltage (e.g., VSS) to the second well 206 by coupling the second supply voltage VSS to the implants 208. In the case, the region 214 may be referred to as P-well pickup region. In some alternative embodiments, the region 214 is coupled to the first supply voltage VDD and is configured to provide the first supply voltage VDD as the bias voltage (e.g., VDD) to the second well 206. In some embodiments, the fourth portion 206b of the second well 206 is positioned within the region 214. In some embodiments, the fourth portion 206b of the second well 206 extends in the X direction from the gate 222i to the gate 222l. However, the embodiment of the disclosure is not limited thereto, in other embodiments, the fourth portion 206b of the second well 206 may extend in the X direction within any number of the gate.

As shown in FIG. 2B, the region 216 corresponds to the active region pattern 116 of the layout design 100 of FIG. 1C. The region 216 is a tap cell of the IC structure 200 and is coupled to the first supply voltage VDD. In other words, the region 216 is configured to provide the first supply voltage VDD as the bias voltage (e.g., VDD) to the second portion 204b of the first well 204 by coupling the first supply voltage VDD to the implants 210. In the case, the region 216 may be referred to as N-well pickup region. In some alternative embodiments, the region 216 is coupled to the second voltage supply VSS and is configured to provide the second supply voltage VSS as the bias voltage (e.g., VSS) to the second portion 204b of the first well 204. In some embodiments, the second portion 204b of the first well 204 is positioned within the region 216. In some embodiments, the second portion 204b of the first well 204 extends in the X direction from the gate 222e to the gate 222j. However, the embodiment of the disclosure is not limited thereto, in other embodiments, the second portion 204b of the first well 204 may extend in the X direction within any number of the gate.

As shown in FIG. 2C and FIG. 2D, the IC structure 200 further includes a plurality of isolation regions 201 and 203. Specifically, the isolation regions 201 are used to separate the active region patterns 112, 114, 116, and 118 (FIG. 1C). The isolation regions 203 are used to separate adjacent implants 208 or 210. The isolation regions 201 have a greater width and a greater depth than those of the isolation regions 203. In some embodiments, the narrow isolation regions 203 are used for defining Finfet oxide definition (OD). In some embodiments, bottom surfaces of the isolation regions 201 and 203 are higher than bottom surfaces of the first well 204 and/or second well 206. In some embodiments, the isolation regions 201 and 203 may be an oxide (e.g., silicon oxide), a nitride (e.g., silicon nitride), the like, or a combination thereof, and may be formed by depositing an insulation material in an acceptable deposition process, such as a high density plasma chemical vapor deposition (HDP-CVD), a flowable CVD (FCVD), the like, or a combination thereof; planarizing the insulation material in an acceptable planarization process, such as a chemical mechanical polish (CMP), an etch back process, the like, or a combination thereof; and recessing the insulation material in an acceptable etching process, such as a dry etching, a wet etching, or a combination thereof. In some alternative embodiments, the isolation regions 201 and 203 may be a shallow trench isolation (STI) structure.

Figure 3:
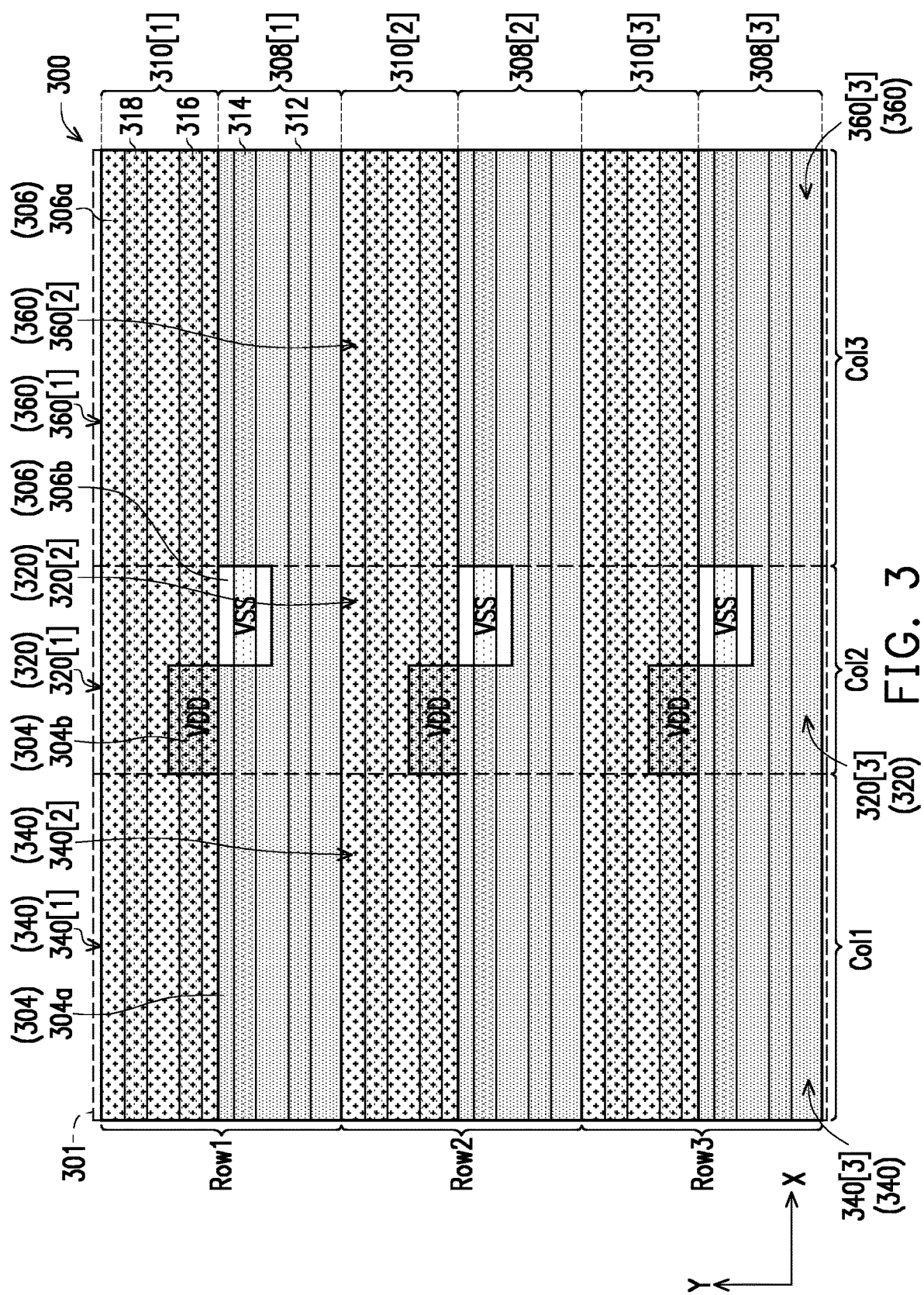
FIG. 3 is a diagram of a layout design of an IC structure in accordance with some embodiments.

FIG. 3 is a diagram of a layout design 300 of an IC structure in accordance with some embodiments. Components that are the same or similar to those in FIGS. 1A-1C are given the same reference numbers, and detailed description thereof is thus omitted. In addition, the set of gate layout patterns is omitted in FIG. 3 for clarity.

Referring to FIG. 3, the layout design 300 includes an array of cells 301 having 3 rows and 3 columns. The 3 rows of cells are arranged alternately in the Y direction and the 3 columns of cells are arranged alternately in the X direction. Three rows and three columns of cells are used for illustration. A different number of rows or columns is within the contemplated scope of the present disclosure.

Each row of array 301 includes a set of tap cells 320 disposed between two sets of standard cells 340 and 360. For example, row 1 of array of cells 301 includes a tap cell 320[1] disposed between adjacent standard cells 340[1] and 360[1]. Similarly, row 2 of array of cells 301 includes a tap cell 320[2] disposed between adjacent standard cells 340[2] and 360[2].

Each of the tap cells in the set of tap cells 320 shown in the layout design 300 are the same as the layout design 100 and will not be described. For example, the tap cells 320[1], 320[2], and 320[3] are the same as the layout design 100. A width of the set of tap cells 320 (e.g., column 2) may be equal to the first width W1 (FIG. 1A) or wider according to needs. In some alternative embodiments, one or more of the tap cells 320[1], 320[2], and 320[3] may be rotated 180 degrees with respect to the original tap cell layout 320[1], 320[2], and 320[3].

The set of standard cells 340 or 360 includes one or more standard cells. In some embodiments, the standard cell is a logic gate cell. In some embodiments, the logic gate cell includes an AND, OR, NAND, NOR, XOR, INV, AND-OR-Invert (AOI), OR-AND-Invert (OAI), MUX, Flip-flop, BUFF, Latch, delay, clock cells or the like. In some embodiments, the standard cell is a memory cell. In some embodiments, the memory cell includes a static random access memory (SRAM), a dynamic RAM (DRAM), a resistive RAM (RRAM), a magnetoresistive RAM (MRAM), read only memory (ROM), or the like. In some embodiments, the standard cell includes one or more active or passive elements. Examples of active elements include, but are not limited to, transistors and diodes. Examples of the transistors include, but are not limited to, metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), FinFETs, planar MOS transistors with raised source/drain, or the like. Examples of the passive elements include, but are not limited to, capacitors, inductors, fuses, resistors, or the like.

The layout design 300 further includes active regions 312, 314, 316 and 328. The active regions 312, 314, 316 and 328 may continuously extend from the tap cell 320[1] (i.e., column 2) through the standard cell 340[1] (i.e., column 1) and the standard cell 360[1] (i.e., column 3). The active regions 312, 314, 316, and 318 correspond to the active region patterns 112, 114, 116, and 118 (FIG. 1C), respectively. The layout design 300 may include other active regions in other rows and not shown for case of illustration.

The active regions 316 and 318 in the row 1 of an implant layout pattern 310[1] extend continuously through the layout design 300. Similarly, the active regions in the rows 2 or 3 of corresponding implant layout pattern 310[2] or 310[3] extend continuously through the layout design 300. In some embodiments, the active regions 312 and 314 in the row 1 of an implant layout pattern 308[1] extend continuously through the layout design 300. Similarly, the active regions in the rows 2 or 3 of corresponding implant layout pattern 308[2] or 308[3] extend continuously through the layout design 300. Herein, the implant layout patterns 310[1], 310[2] and 310[3] are the same as the first set of implant layout patterns 110, and the implant layout patterns 308[1], 308[2] and 308[3] are the same as the first set of implant layout patterns 108.

The first and second well layout patterns 304 and 306 are the same as the first and second well layout patterns 104 and 106 respectively (FIG. 1C). In detail, as shown in FIG. 3, the first well layout pattern 304 may include a first layout pattern 304a and a second layout pattern 304b adjacent to the first layout pattern 304a and extending into in the second well layout pattern 306. The second well layout pattern 306 may include a third layout pattern 306a and a fourth layout pattern 306b adjacent to the third layout pattern 306a and extending into in the first well layout pattern 304.

As shown in FIG. 3, the active regions 316 in the second layout pattern 304b represents the portion of the layout design 300 coupled to the first supply voltage VDD to provide the first supply voltage VDD as a bias voltage to the implant layout pattern 310[1] in the second layout pattern 304b of the first well layout pattern 304. On the other hands, the active regions 314 in the fourth layout pattern 306b represents the portion of the layout design 300 coupled to the second supply voltage VSS to provide the second supply voltage VSS as a bias voltage to the implant layout pattern 308[1] in the fourth layout pattern 306b of the second well layout pattern 306.

In some embodiments, at least one of the active regions 312, 314, 316, and 318 has SiGe (not labelled). In the case, by continuously extending the active regions 312, 314, 316, and 318 in the rows 1, 2 and 3 through the edges of layout design 300 or through adjacent the set of standard cells 340 and 360 causes an increase in the compressive strain of the SiGe of the layout design 300 compared to other approaches. In some embodiments, by increasing the compressive strain of the SiGe of the layout design 300, the layout design 300 does not have reduced mobility degradation and current degradation like other approaches, resulting in increased driving current capability of a circuit manufactured by the layout design 300 and better performance than other approaches. In some embodiments, by having an improved compressive strain of the SiGe of the layout design 300, the layout design 300 is able to have similar driving current capability as other approaches while occupying less area than the other approaches resulting in an overall reduction in physical size of layout design 300.

Figure 4:
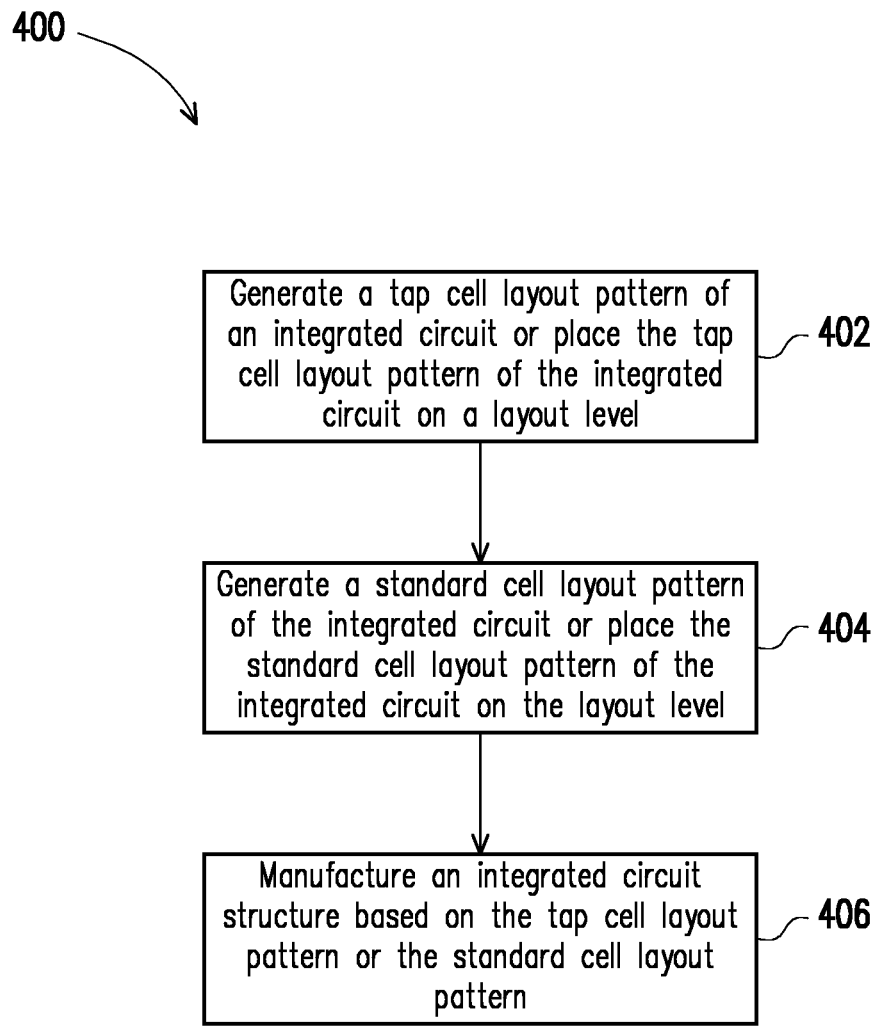
FIG. 4 is a flowchart of a method of forming an IC structure in accordance with some embodiments.

FIG. 4 is a flowchart of a method 400 of forming an IC structure in accordance with some embodiments. It is understood that additional operations may be performed before, during, and/or after the method 400 depicted in FIG. 4, and that some other processes may only be briefly described herein. In some embodiments, the method 400 is usable to form integrated circuits, such as the IC structure 200 (FIGS. 2A-2D), other IC structures or the like.

In an operation 402 of the method 400, a tap cell layout design of an integrated circuit is generated or the tap cell layout design of the integrated circuit is placed on a layout level. In some embodiments, the layout level is located above a substrate layout pattern. In some embodiments, the tap cell layout pattern generated by the operation 402 is the tap cell layout pattern 320 (FIG. 3).

In an operation 404, a standard cell layout pattern of the integrated circuit is generated or the standard cell layout pattern of the integrated circuit is placed on the layout level. In some embodiments, the standard cell layout pattern generated by the operation 404 is the standard cell layout pattern 340 or 360 (FIG. 3).

In an operation 406, an IC structure is manufactured based on the tap cell layout design or the standard cell layout pattern. In some embodiments, the IC structure manufactured by the operation 406 is the IC structure 200 (FIGS. 2A-2D).

Figure 5:
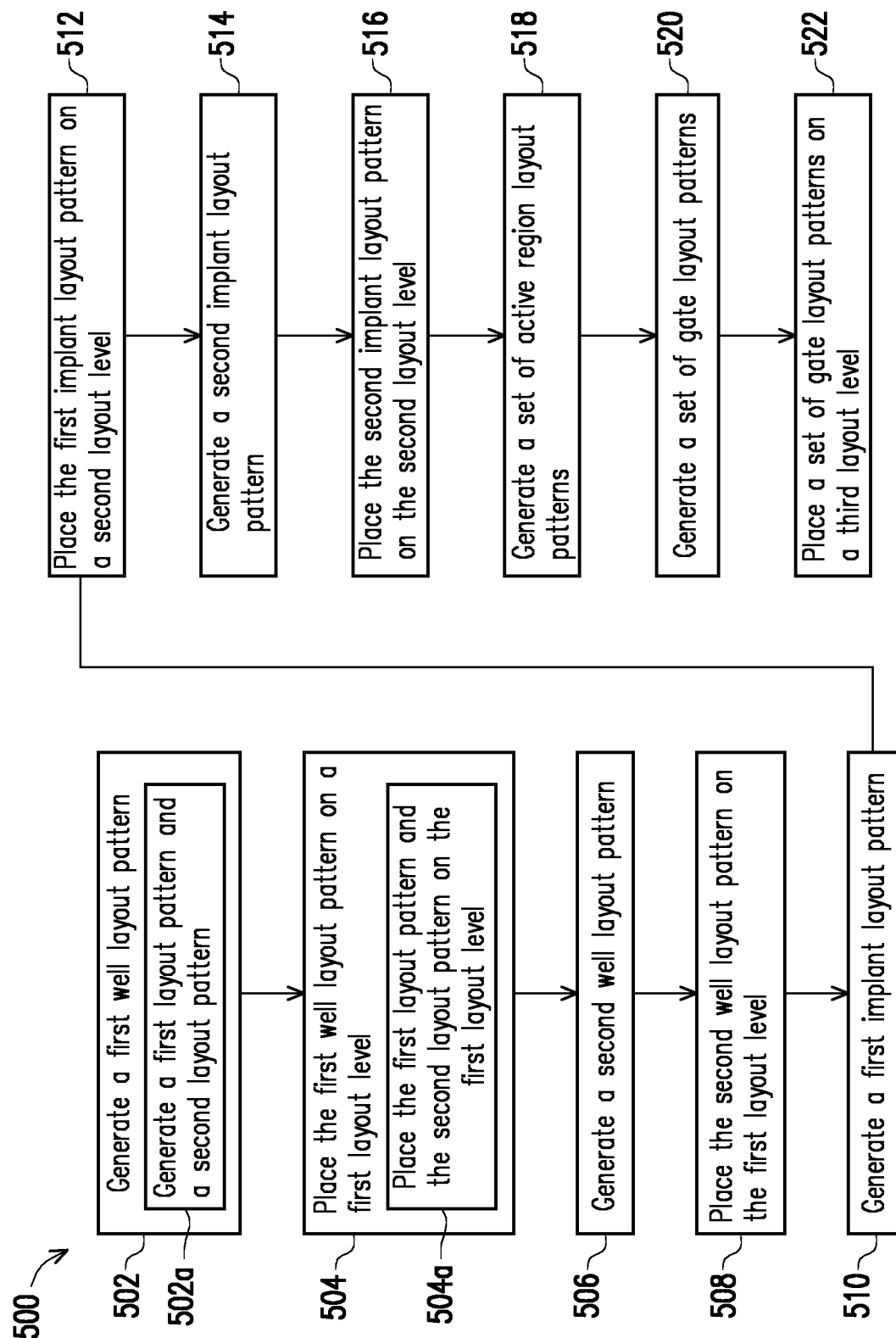
FIG. 5 is a flowchart of a method of forming an IC structure in accordance with some embodiments.

FIG. 5 is a flowchart of a method 500 of manufacturing an IC in accordance with some embodiments. It is understood that additional operations may be performed before, during, and/or after the method 500 depicted in FIG. 5, and that some other processes may only be briefly described herein. In some embodiments, the method 500 is usable to form ICs, such as the IC structure 200 (FIGS. 2A-2D), other IC structures or the like.

In an operation 502 of the method 500, a first well layout pattern is generated. In some embodiments, the operation 502 includes an operation 502a. In the operation 502a of the method 500, a first layout pattern and a second layout pattern are generated. In some embodiments, the first well layout pattern generated by the operation 502 is the first well layout pattern 104 (FIG. 1A); the first layout pattern generated by the operation 502a is the first layout pattern 104a (FIG. 1A); and the second layout pattern generated by the operation 502a is the second layout pattern 104b (FIG. 1A).

The method 500 continues with an operation 504, where the first well layout pattern is placed on a first layout level. In some embodiments, the operation 504 includes an operation 504a. In the operation 504a of the method 500, the first layout pattern and the second layout pattern are placed on the first layout level. In some embodiments, the first layout level is a level above the substrate 202 (FIGS. 2A-2D).

The method 500 continues with an operation 506, where a second well layout pattern is generated. In some embodiments, the second well layout pattern generated by the operation 506 is the second well layout pattern 106 having the layout pattern 106a and 106b (FIG. 1B).

The method 500 continues with an operation 508, where the second well layout pattern is placed on the first layout level. In some embodiments, the second well layout pattern 106 is placed adjacent to first well layout pattern 104, as shown in FIGS. 1A-1C. The second layout pattern 104b may be disposed between the first layout pattern 104a and the second well layout pattern 106, and the fourth layout pattern 106b may be disposed between the third layout pattern 106a and the first well layout pattern 104.

The method 500 continues with an operation 510, where a first implant layout pattern is generated. In some embodiments, the first implant layout pattern generated by the operation 510 is the first set of implant layout patterns 110 or the first set of implant layout patterns 310. In some embodiments, the first implant layout pattern of the method 500 is one or more of implant layout pattern 110, 310[1], 310[2] or 310[3].

The method 500 continues with an operation 512, where the first implant layout pattern is placed on a second layout level. In some embodiments, the second layout level is the level above the first layout level. In some embodiments, the first implant layout pattern 210 is placed over the second portion 204b and the third portion 206a (FIG. 2B).

The method 500 continues with an operation 514, where a second implant layout pattern is generated. In some embodiments, the second implant layout pattern of the method 500 is second set of implant layout patterns 108 or second set of implant layout patterns 308. In some embodiments, the second implant layout pattern of method 500 is one or more of implant layout pattern 108, 308[1], 308[2], or 308[3].

The method 500 continues with an operation 516, where the second implant layout pattern is placed on the second layout level. In some embodiments, the second implant layout pattern 208 is placed over the first portion 204a and the fourth portion 206b (FIG. 2A).

The method 500 continues with an operation 518, a set of active region layout patterns (e.g., active region patterns 112, 114, 116 and 118) is generated. In some embodiments, the set of active region layout patterns of the method 500 is the active region patterns 112, 114, 116 and 118 or the active regions 312, 314, 316, and 318. In some embodiments, the active regions of the IC structure 200 are defined by the isolation regions 203 (FIGS. 2C-2D). The active regions are the level between the first layout level and the second layout level.

The method 500 continues with an operation 520, a set of gate layout patterns is generated. In some embodiments, the set of gate layout patterns of the method 500 is one or more of set of gate layout patterns 120 (FIG. 1C).

The method 500 continues with an operation 522, where the set of gate layout patterns is placed on a third layout level. Third layout level is different from the first layout level or the second layout level. In some embodiments, the third layout level is the level above the first and second layout level.

In some embodiments, one or more of operations 502, 506, 510, 514, 518, 520 is not performed.

One or more of the operations 402, 404 or 502-522 is performed by a processing device configured to execute instructions for manufacturing an IC, such as the IC structure 200. In some embodiments, one or more of the operations 402, 404 or 502-522 is performed using a same processing device as that used in a different one or more of the operations 402, 404 or 502-522. In some embodiments, a different processing device is used to perform one or more of the operations 402, 404 or 502-522 from that used to perform a different one or more of the operations 402, 404 or 502-522.

Figure 6:
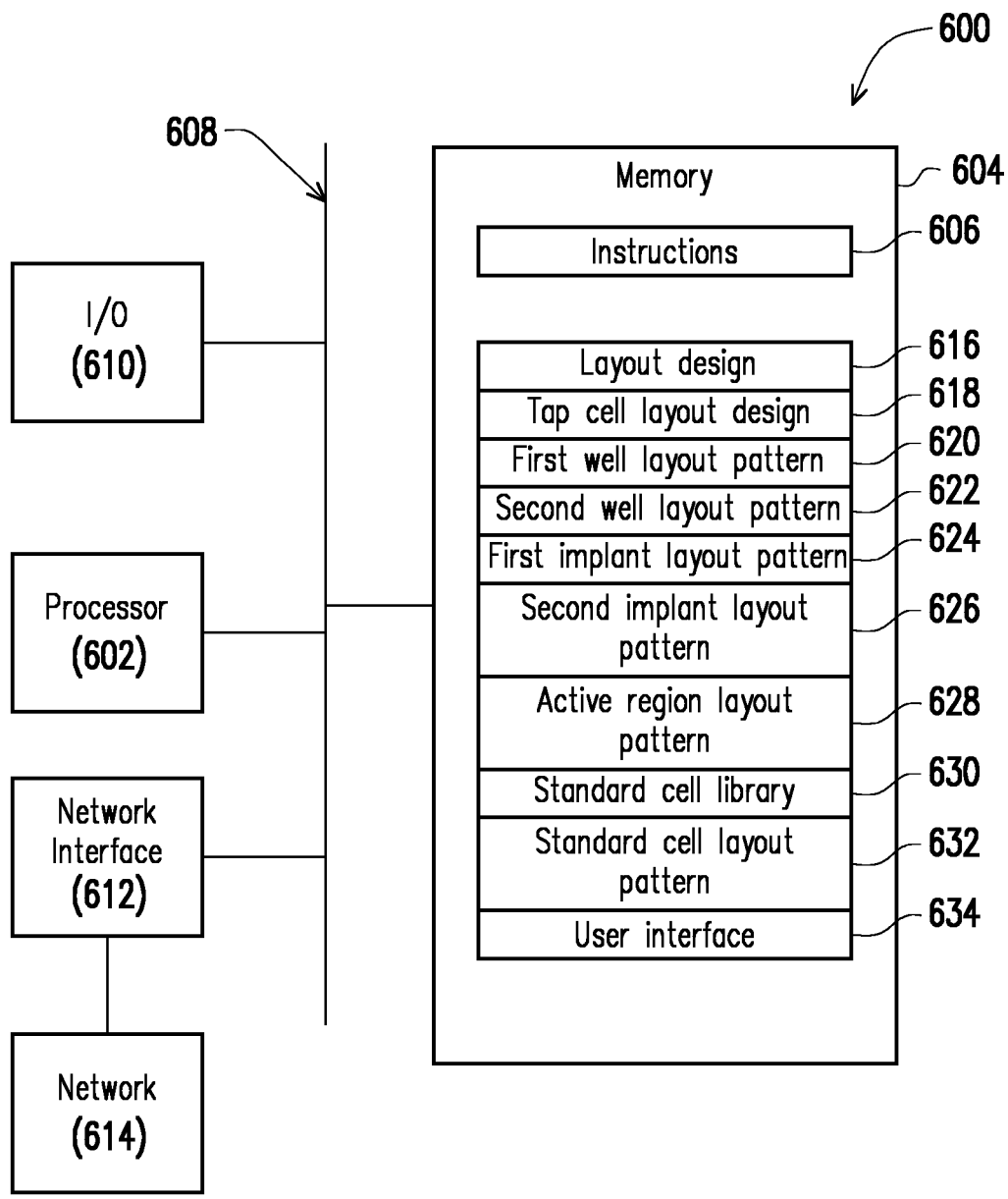
FIG. 6 is a block diagram of a system of designing an IC layout design, in accordance with some embodiments.

FIG. 6 is a schematic view of a system 600 for designing an IC layout design in accordance with some embodiments. The system 600 includes a hardware processor 602 and a non-transitory, computer readable storage medium 604 encoded with, i.e., storing, the computer program code 606, i.e., a set of executable instructions. The computer readable storage medium 604 is also encoded with instructions 606 for interfacing with manufacturing machines for producing the integrated circuit. The processor 602 is electrically coupled to the computer readable storage medium 604 via a bus 608. The processor 602 is also electrically coupled to an I/O interface 610 by the bus 608. A network interface 612 is also electrically connected to the processor 602 via the bus 608. The network interface 612 is connected to a network 614, so that the processor 602 and the computer readable storage medium 604 are capable of connecting to external elements via the network 614. The processor 602 is configured to execute the computer program code 606 encoded in the computer readable storage medium 604 in order to cause the system 600 to be usable for performing a portion or all of the operations as described in the method 400 or 500.

In some embodiments, the processor 602 is a central processing unit (CPU), a multi-processor, a distributed processing system, an application specific integrated circuit (ASIC), and/or a suitable processing unit.

In some embodiments, the computer readable storage medium 604 is an electronic, magnetic, optical, electromagnetic, infrared, and/or a semiconductor system (or apparatus or device). For example, the computer readable storage medium 604 includes a semiconductor or solid-state memory, a magnetic tape, a removable computer diskette, a random access memory (RAM), a read-only memory (ROM), a rigid magnetic disk, and/or an optical disk. In some embodiments using optical disks, the computer readable storage medium 604 includes a compact disk-read only memory (CD-ROM), a compact disk-read/write (CD-R/W), and/or a digital video disc (DVD).

In some embodiments, the storage medium 604 stores the computer program code 606 configured to cause system 600 to perform the method 400 or 500. In some embodiments, the storage medium 604 also stores information needed for performing the method 400 or 500 as well as information generated during performing the method 400 or 500, such as layout design 616, tap cell layout pattern 618, first well layout pattern 620, second well layout pattern 622, first implant layout pattern 624, second implant layout pattern 626, active region layout pattern 628, standard cell library 630, standard cell layout pattern 632, user interface 634, and/or a set of executable instructions to perform the operation of the method 400 or 500.

In some embodiments, the storage medium 604 stores instructions for interfacing with manufacturing machines. The instructions enable the processor 602 to generate manufacturing instructions readable by the manufacturing machines to effectively implement the method 400 or 500 during a manufacturing process.

The system 600 includes an I/O interface 610. The I/O interface 610 is coupled to external circuitry. In some embodiments, the I/O interface 610 includes a keyboard, keypad, mouse, trackball, trackpad, and/or cursor direction keys for communicating information and commands to the processor 602.

The system 600 also includes a network interface 612 coupled to the processor 602. The network interface 612 allows system 600 to communicate with the network 614, to which one or more other computer systems are connected. The network interface 612 includes wireless network interfaces such as BLUETOOTH, WIFI, WIMAX, GPRS, or WCDMA; or wired network interface such as ETHERNET, USB, or IEEE-1394. In some embodiments, the method 400 or 500 is implemented in two or more systems 600, and information such as layout design, tap cell layout pattern, first well layout pattern, second well layout pattern first implant layout pattern, second implant layout pattern, active region layout pattern, standard cell library, standard cell layout pattern and user interface are exchanged between different systems 600 by the network 614.

The system 600 is configured to receive information related to a layout design through the I/O interface 610 or the network interface 612. The information is transferred to the processor 602 by the bus 608 to determine a layout design for producing the IC structure 200. The layout design is then stored in the computer readable medium 604 as the layout design 616. The system 600 is configured to receive information related to a tap cell layout pattern through the I/O interface 610 or the network interface 612. The information is stored in the computer readable medium 604 as the tap cell layout pattern 618. The system 600 is configured to receive information related to a first well layout pattern through I/O interface 610 or network interface 612. The information is stored in the computer readable medium 604 as the first well layout pattern 620. The system 600 is configured to receive information related to a second well layout pattern through the I/O interface 610 or the network interface 612. The information is stored in the computer readable medium 604 as the second well layout pattern 622. The system 600 is configured to receive information related to a first implant layout pattern through the I/O interface 610 or the network interface 612. The information is stored in computer readable medium 604 as first implant layout pattern 624. The system 600 is configured to receive information related to a second implant layout pattern through the I/O interface 610 or the network interface 612. The information is stored in computer readable medium 604 as second implant layout pattern 626. The system 600 is configured to receive information related to an active region layout pattern through the I/O interface 610 or the network interface 612. The information is stored in computer readable medium 604 as active region layout pattern 628. The system 600 is configured to receive information related to a standard cell library through the I/O interface 610 or the network interface 612. The information is stored in the computer readable medium 604 as standard cell library 630. The system 600 is configured to receive information related to a standard cell layout pattern through the I/O interface 610 or the network interface 612. The information is stored in the computer readable medium 604 as standard cell layout pattern 632. The system 600 is configured to receive information related to a user interface through the I/O interface 610 or the network interface 612. The information is stored in the computer readable medium 604 as user interface 634.

In some embodiments, the method 400 or 500 is implemented as a standalone software application for execution by a processor. In some embodiments, the method 400 or 500 is implemented as a software application that is a part of an additional software application. In some embodiments, the method 400 or 500 is implemented as a plug-in to a software application. In some embodiments, the method 400 or 500 is implemented as a software application that is a portion of an EDA tool. In some embodiments, the method 400 or 500 is implemented as a software application that is used by an EDA tool. In some embodiments, the EDA tool is used to generate a layout of the integrated circuit device. In some embodiments, the layout is stored on a non-transitory computer readable medium. In some embodiments, the layout is generated using a tool such as VIRTUOSO® available from CADENCE DESIGN SYSTEMS, Inc., or another suitable layout generating tool. In some embodiments, the layout is generated based on a netlist which is created based on the schematic design.

The system 600 of FIG. 6 generates layout designs (e.g., layout design 100 or 300) of the IC structure 200 that occupy less area than other approaches. Components that are the same or similar to those in FIGS. 1A-1C, 2A-2D, 3, 4, 5, and 6 are given the same reference numbers, and detailed description thereof is thus omitted.

According to some embodiments, the tap cell includes a substrate, a first well, a second well, a first doped region, and a second doped region. The substrate has a first region and a second region extending along an X direction. The first well having a first dopant type includes a first portion disposed in the first region; and a second portion adjacent to the first portion and extending into the second region. The second well having a second dopant type different from the first dopant type and includes a third portion disposed in the second region; and a fourth portion adjacent to the third portion and extending into the first region. The first doped region has the first dopant type and is disposed in the second portion of the first well and the third portion of the second well along the second region. The second doped region has the second dopant type and is disposed in the first portion of the first well and the fourth portion of the second well along the first region.

According to some embodiments, an integrated circuit structure includes a standard cell, a tap cell, a first well, a second well, a first set of implants, and a first active region. The standard cell and the tap cell are adjacent to each other. The first well has a first dopant type and a second well has a second dopant type. The first and second wells continuously extend through the standard cell and the tap cell in an X direction. The first well in the tap cell has a first jog extending into the second well. The first set of implants has the first dopant type and is at least disposed in the first jog of the first well to be coupled to a first supply voltage. The first active region continuously extends from the first jog of the first well through the tap cell and the standard cell along the X direction.

According to some embodiments, a method of forming an integrated circuit structure includes: generating a tap cell layout pattern corresponding to fabricating a tap cell of an integrated circuit structure; generating a set of standard cell layout patterns adjacent to the tap cell layout pattern, the set of standard cell layout patterns corresponding to fabricating a set of standard cells of the integrated circuit structure; and generating a set of active region layout patterns corresponding to fabricating a set of active regions of the integrated circuit structure. The generating the tap cell layout pattern includes: generating a first well layout pattern corresponding to fabricating a first well of the integrated circuit structure, the first well having a first dopant type; generating a second well layout pattern corresponding to fabricating a second well of the integrated circuit structure, the second well having a second dopant type, wherein the first well layout pattern has a first jog pattern extending in the second well layout pattern and the second well layout pattern has a second jog pattern extending in the first well layout pattern; and generating a first implant layout pattern at least overlapping the first jog pattern, the first implant layout pattern corresponding to fabricating a first set of implants of the integrated circuit structure, each implant of the first set of implants having the first dopant type, and at least one implant of the first set of implants being configured to be coupled to a first supply voltage. The set of active region layout patterns comprises a first active region pattern continuously extending from the first jog pattern through the tap cell layout pattern and the standard cell layout pattern along the X direction.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A tap cell, comprising:
   a substrate having a first region and a second region extending along an X direction;
   a first well having a first dopant type in the substrate, wherein the first well comprises a first portion in the first region; and a second portion adjacent to the first portion and extending into the second region to form a first jog;
   a second well having a second dopant type different from the first dopant type in the substrate, wherein the second well comprises a third portion in the second region; and a fourth portion adjacent to the third portion and extending into the first region to form a second jog;
   a first doped region having the first dopant type in the second portion of the first well and the third portion of the second well along the second region, wherein the first doped region has a bottom surface higher than a bottom surface of the first well and the second well; and
   a second doped region having the second dopant type in the first portion of the first well and the fourth portion of the second well along the first region.

2. The tap cell of claim 1, wherein
   the first doped region in the second portion of the first well is configured to be coupled to a first supply voltage; and
   the second doped region in the fourth portion of the second well is configured to be coupled to a second supply voltage different from the first supply voltage.

3. The tap cell of claim 1, further comprising:
   a first active region continuously extending through the second portion of the first well and the third portion of the second well in the X direction; and
   a second active region continuously extending through the first portion of the first well and the fourth portion of the second well in the X direction.

4. The tap cell of claim 1, further comprising a set of gates extending in a Y direction and across the first well and the second well, wherein the first doped region is between a pair of gates of the set of gates.

5. The tap cell of claim 1, wherein the first portion of the first well and the fourth portion of the second well are engaged with each other, the second portion of the first well and the third portion of the second well are engaged with each other, and the second portion of the first well and the fourth portion of the second well are adjacent to each other.

6. The tap cell of claim 1, wherein
   the first doped region has a first length in a Y direction, the first length has a substantially uniform length along the X direction; and
   the second doped region has a second length in the Y direction, the second length has a substantially uniform length along the X direction, and the second length is substantially equal to the first length.

7. An integrated circuit structure, comprising:
   a substrate having a standard cell and a tap cell adjacent to each other;
   a first well having a first dopant type in the substrate, wherein the first well continuously extends through the standard cell and the tap cell in an X direction;
   a second well having a second dopant type in the substrate, wherein the second well continuously extends through the standard cell and the tap cell in the X direction, the first well in the tap cell has a first jog extending into the second well, the second well in the tap cell has a second jog extending into the first well, and the second jog of the second well are adjacent to the first jog of the first well;

a first set of implants having the first dopant type in the first jog of the first well to be coupled to a first supply voltage; and a second set of implants having the second dopant type in the second jog of the second well to be coupled to a second supply voltage.

8. The integrated circuit structure of claim 7, wherein the second supply voltage is different from the first supply voltage.

9. The integrated circuit structure of claim 8, wherein
the first set of implants continuously extends from the first jog of the first well through the tap cell and the standard cell along the X direction; and
the second set of implants continuously extends from the second jog of the second well through the tap cell and the standard cell along the X direction.

10. The integrated circuit structure of claim 7, further comprising:
a first active region continuously extending from the first jog of the first well through the tap cell and the standard cell along the X direction; and
a second active region continuously extending from the second jog of the second well through the tap cell and the standard cell along the X direction.

11. The integrated circuit structure of claim 10, wherein
the first jog of the first well extends across a length of the first active region in a Y direction; and
the second jog of the second well extends across a length of the second active region in the Y direction.

12. The integrated circuit structure of claim 7, further comprising:
a set of gates extending in a Y direction, wherein the set of gates overlap the first well and the second well, wherein at least an implant of the first set of implants is between a pair of gates of the set of gates, and being separated from each other in the X direction.

13. The integrated circuit structure of claim 7, further comprising:
at least one P-type transistor disposed in the first well; and
at least one N-type transistor disposed in the second well.

14. An integrated circuit structure, comprising:
a standard cell and a tap cell adjacent to each other; and
a first well and a second well continuously extending through the standard cell and the tap cell in an X direction, wherein a first interface between the first well and the second well in the standard cell is straight, and a second interface between the first well and the second well comprises a first portion and a second portion, wherein the first and second portion are rectangular, the first portion extends into the first well, and the second portion extends into the second well, such that the second interface forms a square waveform pattern.

15. The integrated circuit structure of claim 14, wherein the first interface extending along the X direction, and the second interface has a protrusion extending from the first interface toward the second well and a recess extending from the first interface toward the first well.

16. The integrated circuit structure of claim 15, further comprising:
a first set of implants having the first dopant type, continuously extending through the tap cell and the standard cell the along the X direction, and further extending across the protrusion without across the recess; and
a second set of implants having the second dopant type, continuously extending through the tap cell and the standard cell the along the X direction, and further extending across the recess without across the protrusion.

17. The integrated circuit structure of claim 16, wherein the first well has a first dopant type and the second well has a second dopant type different from the first dopant type.

18. The integrated circuit structure of claim 16, further comprising:
a first active region continuously extending through the tap cell and the standard cell the along the X direction, and further extending across the protrusion without across the recess; and
a second active region continuously extending through the tap cell and the standard cell the along the X direction, and further extending across the recess without across the protrusion.

19. The integrated circuit structure of claim 18, wherein
the protrusion extends across a length of the first active region in a Y direction; and
the recess extends across a length of the second active region in the Y direction.

20. The integrated circuit structure of claim 14, wherein the standard cell comprises a plurality of transistors, the plurality of transistors comprise:
at least one P-type transistor disposed in the first well; and
at least one N-type transistor disposed in the second well.

* * * * *